United States Patent [19]

Henesian

[11] 4,306,108

[45] Dec. 15, 1981

[54] SOLAR POWER SUPPLY FOR SPACECRAFT

[75] Inventor: Aram Henesian, Cupertino, Calif.

[73] Assignee: Lockheed Missiles & Space Company, Inc., Sunnyvale, Calif.

[21] Appl. No.: 168,150

[22] Filed: Jul. 14, 1980

[51] Int. Cl.³ .................. H01L 31/04; H01L 31/18
[52] U.S. Cl. .................................. 136/245; 136/244; 136/292; 29/572; 244/173
[58] Field of Search ................. 136/244, 245, 292; 244/173; 29/572

[56] References Cited

U.S. PATENT DOCUMENTS

| | | | |
|---|---|---|---|
| 3,459,391 | 8/1969 | Haynos | 244/1 R |
| 3,874,931 | 4/1975 | Haynos | 136/244 |
| 4,019,924 | 4/1977 | Kurth | 136/251 |

OTHER PUBLICATIONS

"Solar Arrays for Future Space Programs," Lockheed Missiles & Space Co. Brochure, May, 1979.

Primary Examiner—Aaron Weisstuch

Attorney, Agent, or Firm—John J. Morrissey; Billy G. Corber

[57] ABSTRACT

A solar power supply for a spacecraft comprises an array of semiconductor devices for photovoltaic conversion of sunlight into electrical energy. Each semiconductor device is secured by a substantially stress-free electrically conductive joint to a flexible dielectric substrate that can be folded into a compact stowage configuration or opened into an elongate operational configuration. The stress-free joint is formed by securing an electrical terminal of the semiconductor device to a stress-relieving electrical conductor that is affixed to the substrate. Preferably, the stress-relieving conductor is a metallic wire mesh, a peripheral portion of which is adhesively bonded to the substrate circumjacent an aperture in the substrate. A pattern of metallic traces formed on the substrate provides a circuit for connecting the wire mesh to connectors for coupling electrical power generated by the array of semiconductor devices to an electrical load on the spacecraft.

21 Claims, 3 Drawing Figures

U.S. Patent   Dec. 15, 1981   4,306,108
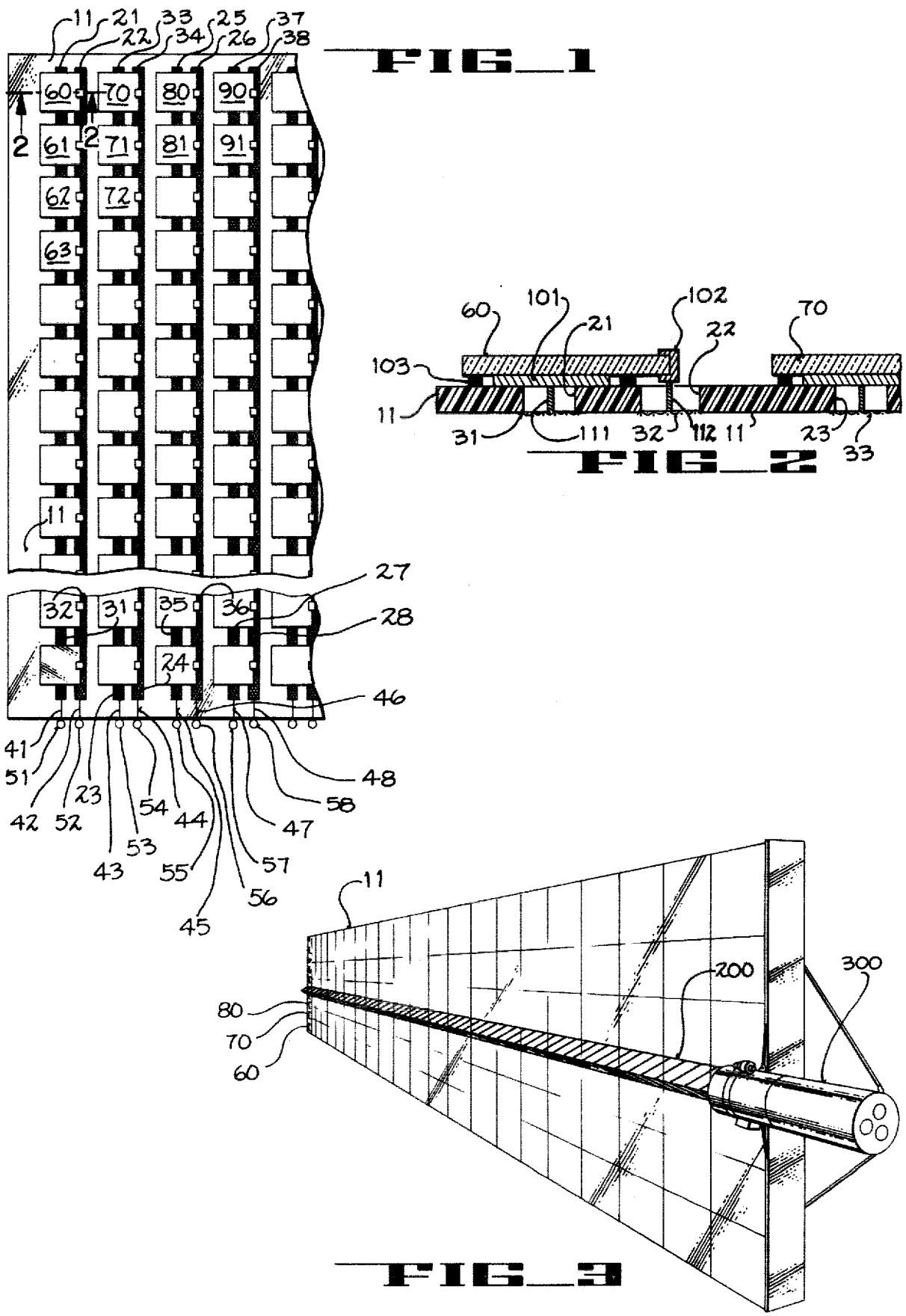

SOLAR POWER SUPPLY FOR SPACECRAFT

BACKGROUND OF THE INVENTION

1. Field of the Invention

This invention pertains to solar power supplies, particularly for use in satellites and other spacecraft.

2. Description of the Prior Art

Earth-orbit satellites have been provided with solar power supplies comprising arrays of semiconductor devices that directly convert sunlight to electrical energy. The semiconductor devices, called "solar cells", are typically arrayed on rigid substrates affixed to exterior portions of the satellites. On present U.S. satellites, solar cells are typically mounted in arrays on rigid honeycomb substrates. However, proposals have been made to provide future satellites with power supplies comprising arrays of solar cells mounted on flexible substrates that are foldable into a pleated or accordion-like configuration for stowage during satellite flight from earth to orbit. For a solar power supply as proposed prior to the present invention, attachment of individual solar cells to a flexible dielectric substrate would be accomplished by welding the solar cells to metallic traces formed by a photolithographic process on a surface of the dielectric substrate.

A solar power supply on a spacecraft for journeying into "deep space" (i.e., into orbital or non-orbital flight more than 300 miles from the earth) would be subjected to very rapid fluctuations in temperature over a wide temperature range. As the power supply changes orientation with respect to the sun, temperatures experienced by the power supply might fluctuate from near absolute zero to upwards of 300° C. in time intervals on the order of ten seconds depending upon factors such as orbit inclination.

A solar power supply has previously been proposed in which metallic traces would be formed on a first sheet of flexible dielectric substrate material, with a second sheet of flexible dielectric substrate material being disposed overlying the metallic traces on the first sheet. Holes would be provided in the overlying second sheet of substrate material, and solar cells would be positioned in an array over the holes in the overlying second sheet. Electrical terminals of the solar cells would be welded through the holes in the overlying second sheet to the metallic traces on the underlying first sheet. The weld joints between the electrical terminals of the solar cells and the electrically conductive traces on the underlying first substrate sheet, however, would be subjected to severe and repeated mechanical stresses during temperature cycling in deep space because the electrical terminals of the solar cells and the metallic traces on the underlying first substrate sheet would generally have coefficients of thermal expansion that are radically different from the coefficient of thermal expansion of the dielectric substrate material. Such stresses would in time tend to rupture the weld joints.

It has been proposed to relieve mechanical stresses that would otherwise adversely affect the above-described weld joints between solar cells and metallic traces on the underlying first substrate sheet by using an elastomer for adhesively bonding the solar cells to the overlying second substrate sheet, so that the weld joints would function primarily as electrical contacts and would not serve as the primary mechanical connections between the solar cells and the substrate. However, elastomeric adhesives tend to lose bonding strength at high temperatures and to become rigid at low temperatures. Thus, elastomeric adhesive bonding cannot be relied upon at the temperature extremes of deep space to provide the mechanical bonding required to secure solar cells to a substrate. Furthermore, differences between the coefficients of thermal expansion of the substrate material and the solar cell semi-conductor material would impose stresses directly on the semi-conductor material, thereby tending to fracture the semiconductor material during temperature cycling.

Until the present invention, there has been no technique for attaching an array of solar cells to a flexible dielectric substrate by means of an electrically conductive joint that remains substantially unstressed during temperature cycling over the range of temperatures experienced in deep space.

SUMMARY OF THE INVENTION

It is an object of the present invention to provide a substantially stress-free electrically conductive joint for securing a solar cell to a flexible dielectric substrate.

In accordance with the present invention, a stress-relieving electrical conductor is affixed to the dielectric substrate in such a way as to enable the conductor to expand or contract in response to stresses thermally induced in the conductor, and an electrical terminal of the solar cell is attached to the stress-relieving conductor in electrical connection therewith. The stress-relieving conductor contemplated for the practice of this invention is a wire mesh having peripheral or edge portions that are affixed to the substrate as by adhesive bonding or mechanical stapling. Central portions of the wire mesh, however, are unattached to the substrate so that the mesh can expand and contract in response to thermally induced stresses without causing separation of the peripheral or edge portions from a substrate.

Preferably, the positive electrical terminal of the solar cell is electrically connected to one stress-relieving wire mesh conductor, and the negative electrical terminal of the solar cell is electrically connected to an adjacent stress-relieving wire mesh conductor. Connection of the electrical terminals of the solar cell to the wire mesh conductors can be accomplished conventionally as by welding, soldering or brazing.

It is a particular object of the present invention to provide an electrical power supply comprising an array of solar cells mounted on a flexible dielectric substrate, with each solar cell being secured to the substrate by an electrically conductive joint that is substantially free of mechanical stresses during high-frequency temperature cycling through the temperatures experienced in deep space.

In the preferred embodiment of the present invention, a plurality of spaced-apart elongate wire meshes are affixed to a surface of the substrate in parallel columns as by adhesive bonding or mechanical stapling. Preferably, the wire meshes span corresponding elongate apertures that are formed in the substrate by conventional means, as by a rotary die or a stepped flat press. For a particular solar cell, the positive electrical terminal is attached to one wire mesh and the negative electrical terminal is attached to an adjacent wire mesh. The solar cells are arranged on the substrate in an array of rows and columns, with the wire meshes providing electrically conductive paths to connectors for coupling the power generated by the solar cells to an external electrical load.

BRIEF DESCRIPTION OF THE DRAWING

FIG. 1 is a representation of an array of solar cells affixed to a flexible dielectric substrate in accordance with the present invention.

FIG. 2 is a cross-sectional view along line 2—2 of FIG. 1.

FIG. 3 shows the flexible substrate of FIG. 1 attached to a telescoping mast in fully extended position.

DESCRIPTION OF PREFERRED EMBODIMENT

A solar spacecraft power supply according to the present invention comprises a flexible dielectric substrate sheet 11 made of a polymeric material, such as polyimide sold by E. I. du Pont de Nemours & Company under the trademark Kapton, polyester sold by E. I. du Pont de Nemours & Company under the trademark Mylar, or parabanic sold by Exxon Corporation under the trademark Tradlon. As indicated in FIG. 1, parallel elongate spaced-apart apertures, such as the pairs of apertures 21 and 22, 23 and 24, 25 and 26, etc., extend lengthwise along the substrate sheet 11. The apertures begin and end within a few inches of opposite ends of the substrate sheet 11. The dimensions of the apertures are not critical, although mechanical stability of the substrate sheet 11 is reduced as the amount of substrate material removed to form the apertures is increased. In particular applications, particularly for an extremely long substrate sheet 11, the apertures would not run the entire length of the substrate sheet 11, but instead apertures of shorter length would run collinearly in place of each of the longer apertures shown in FIG. 1. Particular dimensions of the apertures 21 and 22, 23 and 24, 25 and 26, etc. would depend upon the degree of mechanical rigidity required of the substrate sheet 11 by the environment in which the power supply is to be deployed. For the environment of deep space, aperture widths in the range from $\frac{1}{8}$-inch to $\frac{1}{2}$-inch are contemplated.

Particular dimensions of the substrate sheet 11 would depend upon the size of the power supply, i.e., the surface area of photovoltaic power cells mounted on the substrate sheet 11 for converting incident sunlight to electrical energy. It is anticipated that the substrate sheet 11 could be over one hundred feet in length. Widths in the neighborhood of 24 feet, and thicknesses in the range from 0.001-inch to 0.0015-inch are contemplated for the substrate sheet 11.

An elongate metallic wire mesh 31 is affixed to one surface (i.e., the underside) of the substrate sheet spanning the aperture 21. Corresponding elongate wire meshes 32, 33, 34, 35, 36, etc. are likewise affixed to the underside of the substrate sheet 11 spanning the apertures 22, 23, 24, 25, 26, etc. Wire meshes suitable for the practice of this invention are available in a variety of annealed ductile materials suitable for soldering or welding, e.g., copper, nickel, Monel, and stainless steel. Various plated or coated materials such as copper-coated carbon steel are available in wire meshes. Wire meshes can be obtained in many different weaves and sizes, including stranded wire configurations, depending upon the desired mesh flexibility. A suitable wire mesh for a particular power supply application according to the present invention could be selected, e.g., from the product line of industrial wire cloth marketed by the Woven Products Division of National-Standard Company.

The wire meshes required to span the apertures 21, 22, 23, 24, 25, 26, etc. can be affixed to the substrate sheet 11 by mechanical stapling or by adhesive bonding. Suitable adhesive bonding materials, which are capable of maintaining bonding strength at extreme high and low temperatures, include a laminating epoxy adhesive sold by 3M Corporation under the trademark EC 2290, an acrylic sheet adhesive sold by E. I. du Pont de Nemours & Company under the trademark Pyralux WA/A, and an acrylic pressure-sensitive adhesive sold by 3M Corporation under the trademark Y-966. The large perimeter of the wire mesh overlapping the edge of an elongate aperture in the substrate sheet 11 assures that accidental breakage of the bond between any portion of the mesh perimeter and the substrate 11 would not cause the entire mesh to separate from the substrate. The mesh material is selected to have substantially the same flexibility as the substrate sheet 11, so that the mesh can be rolled or folded along with the substrate sheet 11.

The apertures 21, 22, 23, 24, 25, 26, etc. are not essential to proper affixation of the corresponding meshes 31, 32, 33, 34, 35, 36, etc. to the substrate sheet 11. The meshes could be stapled or bonded to the substrate sheet 11 without spanning any apertures, provided that only edge or perimeter portions of the meshes are affixed to the substrate sheet 11. A central portion, preferably a major portion, of each mesh is unaffixed to the substrate sheet 11 so as to be free to expand and contract in response to fluctuations in temperature, thereby relieving thermally induced stresses. In the preferred embodiment of the invention, as much substrate material underlying the meshes 31, 32, 33, 34, 35, 36 etc. is removed as possible, consistent with the requirement of mechanical stability for the substrate sheet 11, in order to minimize weight.

Pairs of metallic traces 41 and 42, 43 and 44, 45 and 46, etc., which are formed as by photolithographic printing on the substrate sheet 11, electrically connect the wire meshes 31 and 32, 33 and 34, 35 and 36, etc., respectively, to corresponding pairs of electrical connectors 51 and 52, 53 and 54, 55 and 56, etc. The connectors 51, 52, 53, 54, 55, 56, etc. are connectable to an external electrical load.

An array of semiconductor devices 60, ..., 70, ..., 80, ..., 90, ..., etc. is arranged on the substrate sheet 11 for photovoltaic conversion of sunlight to electrical energy. Each semiconductor device, referred to as a solar cell, overlies two of the elongate parallel apertures in the substrate sheet 11. Thus, as shown in FIG. 1, the solar cells 60, 61, 62, 63, ... overlie the apertures 21 and 22, the solar cells 70, 71, 72, ... overlie the apertures 23 and 24, the solar cells 80, 81, ... overlie the apertures 25 and 26, etc. In this way, parallel columns of solar cells are arranged on the substrate sheet 11. The actual number of columns of solar cells is determined by the width of the substrate sheet 11 and the size of the individual solar cells.

Each solar cell has a positive electrical terminal that is connected to the wire mesh spanning one of the apertures in the substrate sheet 11, and a negative electrical terminal that is connected to the wire mesh spanning an adjacent aperture in the substrate sheet 11. Thus, for the solar cells 60, 61, 62, 63, ..., the positive electrical terminals are connected to the wire mesh 31 and the negative electrical terminals are connected to the adjacent wire mesh 32. Similarly, for the solar cells 70, 71, 72, ..., the positive electrical terminals are connected to the wire mesh 33 and the negative electrical terminals are connected to the wire mesh 34. Attachment of the electrical terminals of the solar cells to the corresponding wire meshes is accomplished by conventional means, such as welding, soldering or brazing. An automated technique contemplated for use in attaching the electrical terminals of the solar cells to the corresponding wire meshes involves positioning the terminals in contact with the corresponding meshes and passing electric currents of short duration through the terminal and the meshes. The electric currents would melt the contact portions of the terminals and the meshes to form unitary joints therebetween.

The solar cells in each column would typically be electrically connected in parallel with each other, and each of the columns would typically be connected in series with the other columns of the array. In usual applications, the solar cells would be connected in such a way that the power output of all the solar cells would be additive so as to provide the maximum electrical power to the external load.

The solar cell 60, as shown in cross-sectional view in FIG. 2, is a conventional photovoltaic semiconductor device comprising, e.g., a silicon or gallium arsenide crystal. Typically, the solar cell 60 would have a surface area of from 0.05 to 4 square inches and a thickness of from 0.005 inch to 0.1 inch. A positive metallization layer 101 is bonded as by sputtering to the undersurface of the crystal to form a first electrical terminal, and a negative junction clip 102 is attached to an edge portion of the crystal to form a second electrical terminal. Mechanical attachment of the solar cell 60 to the substrate sheet 11 is provided by an adhesive bonding means 103, which fastens a small portion of the cell 60 to the substrate sheet 11. The adhesive bonding means 103 could advantageously be a pressure-sensitive film adhesive such as the film adhesive sold by 3M Corporation under the trademark Y-966.

As shown in FIG. 2, an electrically conductive joint 111 is provided between the wire mesh 31 and the positive metallization layer 101, and an electrically conductive joint 112 is provided between the wire mesh 32 and the negative junction clip 102. In forming the joints 111 and 112, it is advantageous but not necessary for wire mesh 31 to be of the same material as the positive metallization layer 101, and for the wire mesh 32 to be of the same material as the negative junction clip 102. For a solar cell manufactured with a "wrap-around" negative metallization layer extending from the top surface to the undersurface of the cell along an edge portion thereof, the clip 102 would not be necessary. The joints between the wire mesh 31 and the positive metallization layer 101, and between the wire mesh 32 and the negative junction clip 102 (or alternatively the "wrap-around" negative metallization layer) may be formed by soldering, brazing or welding, or by melting the contacting metal portions of the solar cell and the meshes as by electric current to form a unitary bond.

In the embodiment of the invention shown in FIG. 2, the electrically conductive joints 111 and 112 have an electrical function primarily, and do not serve as the principal means for securing the solar cell 60 to the substrate sheet 11. Because of the inherent flexibility of the meshes 31 and 32, the joints 111 and 112 remain substantially stress-free even during extreme temperature fluctuations. In certain applications, where the nature of the materials and the characteristics of the environment so warrant, a satisfactory mounting of an array of solar cells on a dielectric substrate sheet might be accomplished without adhesively bonding the solar cells to the substrate sheet, but by relying instead on the stress-free electrically conductive joints to provide mechanical support as well for the solar cells.

For solar cells of appropriately small dimensions disposed in a relatively benign temperature environment, it might be satisfactory for only one of the electrical terminals of each cell (e.g., the positive metallization layer 101 of cell 60) to be attached to a wire mesh by a stress-free electrically conductive joint as described above, and for the other electrical terminal of each cell (e.g., the negative junction clip 102 of cell 60) to be connected by a conventional electrically conductive joint to a metallic trace on the substrate sheet. In such an arrangement, mechanical support of the solar cell on the substrate sheet would be performed principally by the stress-free joint with the wire mesh. The conventional joint with the metallic trace would principally perform an electrical contact function rather than a mechanical support function, and would be dimensioned to withstand an acceptable amount of thermal stress without breaking.

In manufacturing a solar power supply according to the present invention, an appropriate pattern of metallic traces (e.g., the traces 41, 42, 43, 45, 46, etc. of FIG. 1) would be formed as by a conventional photolithographic process on a surface of a substrate sheet 11. Then, the elongate slot-like apertures 21, 22, 23, 24, 25, 26, etc. would be cut in the substrate sheet 11 as by a rotary die. Thereafter, the wire meshes 31, 32, 33, 34, 35, 36, etc. would be affixed to the substrate sheet 11 spanning the apertures 21, 22, 24, 25, 26, etc., respectively. Affixation of the wire meshes to the substrate sheet 11 could be accomplished by mechanical stapling or adhesive bonding.

A band of pressure-sensitive adhesive 103 in the form of a narrow tape would be applied to the periphery of the undersurface of each of the solar cells 60, . . . , 70, . . . , 80, . . . , 90, . . . , etc. Then, each solar cell, with its strip of pressure-sensitive adhesive adhering thereto, would be positioned on the substrate sheet 11 so that the positive electric terminal of a given cell overlies the mesh spanning one elongate aperture and the negative electric terminal of the cell overlies the mesh spanning the adjacent aperture. By pressing the cell with its underlying pressure-sensitive adhesive onto the substrate sheet 11, the cell becomes attached to the substrate sheet 11. In this way, the solar cells 60, . . . , 70, . . . , 80, . . . , 90, . . . , etc. are secured to the substrate sheet 11 in rows and columns forming the desired array. Thereafter, the electrically conductive joints are formed between the electrical terminals of the solar cells and the wire meshes affixed to the substrate sheet 11.

The electrically conductive joints (i.e., the joints 111 and 112 as shown in FIG. 2) can be formed by pressing the wire meshes against the electrical terminals of the solar cells, and by then joining the contacting portions of the meshes and electrical terminals as by welding, soldering, brazing or electro-melting. Where a mesh spans a pre-cut aperture in the substrate sheet 11, as in the preferred embodiment, the welding, soldering, brazing or electro-melting process can be accomplished most easily. However, if the meshes were to be affixed to the substrate sheet 11 without spanning pre-cut apertures, pressing of the meshes against the electrical terminals of the solar cells and welding or otherwise joining the contacting portions of the meshes and the electrical terminals of the solar cells would ordinarily cause apertures to be formed in the substrate sheet 11 by melting or burning of the substrate material underneath each of the solar cells. The adhesive bonding means 103 holds the solar cells in position on the substrate sheet 11 to enable the joints between the electrical terminals of the solar cells and the wire meshes to be formed by automatic welding or other joint-forming processes. Thus, use of the adhesive bonding means 103 eliminates the need for a separate positioning tool during the joint-forming process.

As shown in FIG. 3, the flexible substrate sheet 11 is connected to an extendible support structure or mast 200, such as a telescoping fiberglass mast of the kind sold by Astro Research Corporation, or the kind sold by Able Engineering Company. The mast 200 is receivable within a housing 300 that is affixed to the spacecraft, and is extendible on command from a retracted position within the housing 300 to a fully extended operational position. The substrate sheet 11 is foldable so as to assume a compact stowage position when the mast 200 is in the retracted position, and to assume an elongate operational configuration when the mast 200 is in the fully extended position. In the perspective shown in FIG. 3, the mast 200 can be seen running along the undersurface of the substrate sheet 11. The distal end of the substrate sheet 11 is shown in cut-away view to indicate the general position of the solar cells 60, 70, 80, . . . comprising the first row of the array of solar cells affixed to the opposite surface of the substrate sheet 11.

The present invention has been described above primarily in terms of a particular embodiment. Since other embodiments of the invention would be apparent to workers skilled in the art upon perusal of the above description and the accompanying drawing, the above description is to be considered merely as illustrative of the invention. The invention is defined by the following claims and their equivalents.

What is claimed is:

1. A method of fabricating a solar power supply that includes an array of solar cells mounted on a flexible dielectric substrate, said method comprising the steps of:
   (a) affixing a portion of a stress relieving electrically conductive wire mesh to said dielectric substrate, and
   (b) connecting an electrical terminal of each of said solar cells to said wire mesh.

2. The method of claim 1 wherein the step of affixing a portion of an electrically conductive wire mesh to said substrate comprises affixing a perimeter portion of said wire mesh to said substrate.

3. The method of claim 2 wherein the step of affixing a perimeter portion of said wire mesh to said substrate comprises positioning said wire mesh so as to span an aperture in said substrate, and affixing said perimeter portion of said wire mesh to said substrate circumjacent said aperture.

4. The method of claim 2 wherein the step of affixing a perimeter portion of said wire mesh to said substrate comprises stapling said perimeter portion of said wire mesh to said substrate.

5. The method of claim 2 wherein the step of affixing a perimeter portion of said wire mesh to said substrate comprises adhesively bonding said perimeter portion of said wire mesh to said substrate.

6. The method of claim 4 wherein the step of stapling said perimeter portion of said wire mesh to said substrate comprises stapling said perimeter portion to said substrate circumjacent an aperture in said substrate so that said wire mesh spans said aperture.

7. The method of claim 5 wherein the step of adhesively bonding a perimeter portion of said wire mesh to said substrate comprises adhesively bonding said perimeter portion to said substrate circumjacent an aperture in said substrate so that said wire mesh spans said aperture.

8. The method of claim 1 wherein the step of connecting an electrical terminal of each of said solar cells to said wire mesh comprises forming an electrically conductive joint between said electrical terminal and said wire mesh.

9. The method of claim 8 wherein the step of affixing a portion of said wire mesh to said substrate comprises affixing a perimeter portion of said wire mesh to said substrate circumjacent an aperture in said substrate so that said wire mesh spans said aperture.

10. The method of claim 1 comprising the further step of attaching said solar cells to said substrate by adhesive bonding means.

11. An electrical power supply comprising:
   (a) a substrate of flexible dielectric material;
   (b) a stress relieving electrically conductive wire mesh, a peripheral portion of said wire mesh being affixed to said substrate; and
   (c) a plurality of semiconductor devices for photovoltaic conversion of sunlight to electrical energy, each semiconductor device having an electrical terminal connected to said wire mesh.

12. The electrical power supply of claim 11 wherein said peripheral portion of said wire mesh is affixed to said substrate circumjacent an aperture in said substrate so that said wire mesh spans said aperture.

13. The power supply of claim 12 wherein said substrate has first and second apertures, a first electrical terminal of each semiconductor device being electrically connected to a first wire mesh affixed to said substrate spanning said first aperture, and a second electrical terminal of each semiconductor device being electrically connected to a second wire mesh affixed to said substrate spanning said second aperture.

14. The power supply of claim 13 further comprising metallic traces formed on said substrate in a pattern defining circuit means for electrically connecting said wire meshes to connectors for coupling power generated by said semiconductor devices to an electrical load.

15. The power supply of claim 14 wherein said substrate has another plurality of semiconductor devices and third and fourth apertures, with third and fourth wire meshes being affixed to said substrate spanning said third and fourth apertures respectively, a first electrical terminal of each semiconductor device of said other plurality of semiconductor devices being electrically connected to the third wire mesh and a second electrical terminal of each semiconductor device of said other plurality of semiconductor devices being electrically connected to said fourth mesh, said pluralities of semiconductor devices being disposed in an array of parallel columns.

16. The power supply in claim 11 wherein said substrate is made of a sheet of polymeric material.

17. The power supply of claim 11 wherein said wire mesh is affixed to said substrate sheet by an adhesive bond.

18. The power supply of claim 11 wherein said wire mesh is affixed to said substrate sheet by stapling.

19. The power supply of claim 11 further comprising means for attaching said flexible substrate to a telescoping support structure that is extendible from a retracted position to a fully extended position, said substrate being foldable so as to assume a compact stowage configuration when said support structure is in said retracted position and to assume an elongate operational configuration when said support structure is in said fully extended position.

20. A solar power supply for a spacecraft, comprising a telescoping rigid support structure that is extendible from a retracted position to a fully extended position, a substrate sheet of flexible dielectric material attached to said telescoping support structure, said substrate sheet being foldable so as to assume a compact stowage configuration when said support structure is in said retracted position and to assume an elongate operational configuration when said support structure is in said fully extended position, said substrate sheet having first and second apertures, a first stress-relieving electrical conductor being affixed to said substrate sheet spanning said first aperture and a second stress-relieving electrical conductor being affixed to said substrate sheet spanning said second aperture, a plurality of semiconductor devices for photovoltaic conversion of sunlight to electrical energy, a first electrical terminal of each semiconductor device being electrically connected to said first stress-relieving electrical conductor and a second electrical terminal of each semiconductor device being electrically connected to said second stress-relieving electrical conductor, metallic traces being formed on said substrate sheet in a pattern defining circuit means for electrically connecting said first and second stress-relieving electrical conductors to connectors for coupling power from said semiconductor devices to an electrical load on said spacecraft.

21. The spacecraft of claim 20 wherein said first and second stress-relieving electrical conductors are wire meshes.

* * * * *